United States Patent
Jung et al.

(10) Patent No.: US 7,323,419 B2
(45) Date of Patent: Jan. 29, 2008

(54) METHOD OF FABRICATING SEMICONDUCTOR DEVICE

(75) Inventors: Hyung-suk Jung, Suwon-si (KR); Jong-ho Lee, Suwon-si (KR); Jae-eon Park, Yongsin-si (KR); Sung-kee Han, Seongnam-si (KR); Min-joo Kim, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/338,633

(22) Filed: Jan. 25, 2006

(65) Prior Publication Data
US 2006/0175289 A1    Aug. 10, 2006

(30) Foreign Application Priority Data
Feb. 7, 2005    (KR) ............... 10-2005-0011457

(51) Int. Cl.
*H01L 22/302*    (2006.01)
(52) U.S. Cl. ............. 438/710; 438/627; 438/628; 438/653; 438/626
(58) Field of Classification Search ........... 438/710
See application file for complete search history.

(56) References Cited

U.S. PATENT DOCUMENTS

| | | | | |
|---|---|---|---|---|
| 4,381,215 A | * | 4/1983 | Reynolds et al. | 438/643 |
| 6,208,004 B1 | * | 3/2001 | Cunningham | 257/413 |
| 6,534,223 B1 | * | 3/2003 | Yang | 430/5 |
| 6,642,132 B2 | * | 11/2003 | Cho et al. | 438/592 |
| 2004/0113171 A1 | | 6/2004 | Chiu et al. | |

FOREIGN PATENT DOCUMENTS

| | | |
|---|---|---|
| JP | 2004-247573 | 9/2004 |
| KR | 10-2001-0018819 | 3/2001 |

* cited by examiner

*Primary Examiner*—Nadine G. Norton
*Assistant Examiner*—Patricia A. George
(74) *Attorney, Agent, or Firm*—Lee & Morse, P.C.

(57) ABSTRACT

A method of fabricating a semiconductor device including a high-k dielectric for as a gate insulating layer is provided. The method includes forming a high-k dielectric layer and a conductive layer on a substrate, dry etching a portion of the conductive layer, performing a process to increase a wet etch rate of a remaining portion of the conductive layer, and forming a conductive layer pattern by wet etching the remaining portion of the conductive layer after performing the plasma process or the ion implantation. The process to increase the wet etch rate of the conductive layer including a plasma process and/or an ion implantation on the remaining portion of the conductive layer.

21 Claims, 4 Drawing Sheets

METHOD OF FABRICATING SEMICONDUCTOR DEVICE

CLAIMED PRIORITY

This application contains a claim for priority of a prior-filed foreign application in the Republic of Korea 10-2005-0011457 on Feb. 7, 2005.

BACKGROUND OF THE INVENTION

1. Field of the Invention

The invention relates to a method of fabricating a semiconductor device. More particularly, the invention relates to a method of fabricating a semiconductor device that includes a conductive layer and a high-k dielectric layer that are stacked.

2. Description of Related Art

Semiconductor devices, such as, metal oxide semiconductor field effect transistors (MOSFETs) include a gate insulating layer and a gate electrode, which are sequentially stacked on a semiconductor substrate.

Many integrated semiconductor devices are complementary metal oxide semiconductor (CMOS) devices, which include both NMOS transistors and PMOS transistors. CMOS devices generally satisfy requirements such as high operational speeds and low power consumption. To realize a simplified manufacturing process and other fabrication advantages, CMOS semiconductor devices typically use the same kind of a conductive material for the gate electrode of the NMOS transistor and the gate electrode of the PMOS transistor. The conductive material that is commonly used for the gate electrode is polycrystal silicon. A silicon oxide layer is generally used for the gate insulating layer of the semiconductor device.

The speed of semiconductor devices is generally inversely proportional to the thickness of a gate insulating layer. Thus, as the thickness of the gate insulating layer of a semiconductor device decreases, the speed of the semiconductor device generally increases. However, when the thickness of a gate insulating layer is less than a critical thickness, a current leakage problem may occur. Current leakage deteriorates the performance of semiconductor devices. In recent years, the thickness of the silicon oxide gate insulating layer has reached a critical limit. Thus, using a silicon oxide layer as a gate insulating layer may be a technical limitation. High-k dielectric layers are being actively researched as a replacement for gate oxide layers.

A semiconductor device can block leakage current even when the effective oxide thickness (EOT) of the high-k dielectric layer is less than the critical thickness of the silicon oxide layer. The EOT of the high-k dielectric layer corresponds to a thickness of a silicon oxide layer having the same capacitance as the high-k dielectric layer. Therefore, using a high-k dielectric layer as the gate insulating layer has the same effect as using a gate insulating layer that is physically larger than and electrically smaller (e.g., less capacitance) than a silicon oxide layer. Because a dielectric layer having a relatively larger thickness is used, the leakage current of the gate insulating layer can be significantly reduced.

When a high-k dielectric layer is used as the gate insulating layer, the gate insulating layer reacts with the polycrystal silicon and a silicon oxide layer is formed. The formed silicon oxide layer increases the total EOT of the gate insulating layer. When a high-k dielectric layer is used as the gate insulating layer, the fixed charge included in the high-k dielectric layer reduces the mobility of carriers in a channel region under the gate electrode.

SUMMARY OF THE INVENTION

The invention is therefore directed to a method of fabricating a semiconductor device, which substantially overcomes one or more of the problems due to the limitations and disadvantages of the related art.

It is a feature of embodiments of the invention to provide a method of fabricating a semiconductor device that reduces, and preferably prevents, a reaction between a gate electrode and a high-k dielectric layer of the semiconductor device. It is another feature of embodiments of the invention to provide a method of fabricating a semiconductor device that reduces, and preferably prevents, damage to a substrate during patterning of an electrode.

At least one of the above and other features and advantages of the invention may be realized by providing a method of fabricating a semiconductor device that includes forming a high-k dielectric layer and a conductive layer on a substrate, dry etching a portion of the conductive layer, performing a process to increase a wet etch rate on a remaining portion of the conductive layer, and forming a conductive layer pattern by wet etching the remaining portion of the conductive layer after performing the process to increase the wet etch rate.

The process to increase the wet etch rate may include performing a plasma process on the remaining portion of the conductive layer. Performing the plasma process may include performing a plasma process using at least one of an $O_2$ plasma, an $NH_3$ plasma, and an $N_2$ plasma. The process to increase the wet etch rate may include performing an ion implantation on the remaining portion of the conductive layer. Performing the ion implantation may include performing ion implantation using at least one of He, Ne, Ar, Si, Ge, F, Cl, Br, and In. Forming the conductive layer pattern may include performing a wet etch using an HF solution or an etchant formed by combining HF, $H_2O_2$, and deionized water.

Forming the high-k dielectric layer may include forming the high-k dielectric layer using at least one of $HfO_2$, HfAlO, $ZrO_2$, ZrSiO, ZrAlO, $Ta_2O_5$, $TiO_2$, $Al_2O_3$, $Nb_2O_5$, $CeO_2$, $Y_2O_3$, $InO_3$, $IrO_2$, $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, and nitrides thereof. Forming the conductive layer may include forming the conductive layer by stacking a barrier conductive layer and an electrode conductive layer sequentially on the high-k dielectric layer, and dry etching the portion of the conductive layer comprises dry etching the electrode conductive layer. The barrier conductive layer may be formed of a metal or a metal nitride. The barrier conductive layer may be formed to a thickness of less than about 300 Å. The electrode conductive layer may be formed of polycrystal silicon The method may involve removing the exposed portion of the high-k dielectric layer after forming the conductive layer pattern. Forming the conductive layer pattern may include wet etching the barrier conductive layer. The method may involve forming a mask pattern defining the conductive layer pattern on the conductive layer after the forming of the conductive layer, wherein forming the conductive layer pattern may includes simultaneously wet etching the remaining portion of the conductive layer and the mask pattern. Forming the conductive layer may include forming the conductive layer by stacking a barrier conductive layer and an electrode conductive layer sequentially on the high-k dielectric layer, and dry etching the portion of the conductive layer comprises dry etching the portion of the electrode conductive layer and a portion the barrier conductive layer.

At least one of the above and other features and advantages of the invention may be realized by providing a method of fabricating a semiconductor device that includes sequentially forming a dielectric layer, a metal nitride layer, and polycrystal silicon layer on a substrate, forming an electrode by dry etching the polycrystal silicon layer, performing a process to increase a wet etch rate to a portion of the metal nitride layer exposed by formation of the electrode, and forming a metal nitride layer pattern by wet etching the exposed portion of the metal nitride layer.

The dielectric layer may be a high-k dielectric layer. The process to increase the wet etch rate may include performing a plasma process on the exposed portion of the metal nitride layer. The process to increase the wet etch rate may include performing ion implantation on the exposed portion of the metal nitride layer. Forming the metal nitride layer pattern may expose a portion of the dielectric layer and the method may involve removing the exposed portion dielectric layer after forming the metal nitride layer pattern. A mask pattern defining the electrode on the polycrystal silicon layer may be formed after the forming of the polycrystal silicon layer, wherein the step of forming of the metal nitride layer pattern by wet etching may include simultaneously wet etching the metal nitride layer and the mask pattern.

BRIEF DESCRIPTION OF THE DRAWINGS

The above features as well as other features and advantages of the invention will become more apparent to those of ordinary skill in the art by describing in detail exemplary embodiments thereof with reference to the attached drawings in which.

DETAILED DESCRIPTION OF THE INVENTION

Figure 1A:
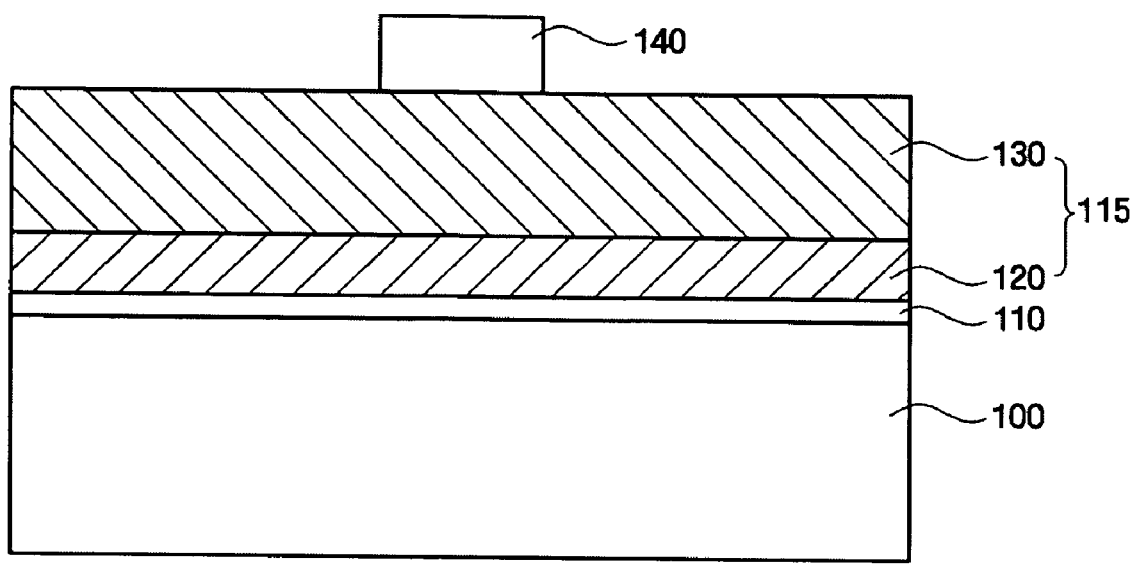
FIGS. 1A through 1F each illustrate a sectional view of a semiconductor device and FIGS. 1A through 1F together illustrate stages in a manufacturing process according to an embodiment of the present invention.

Korean Patent Application No. 10-2005-0011457 filed on Feb. 7, 2005 in the Korean Intellectual Property Office and entitled "Method of Fabricating Semiconductor Device," is incorporated by reference in its entirety.

The invention will now be described more fully with reference to the accompanying drawings, in which exemplary embodiments of this invention are shown. Advantages and features of the invention and methods of accomplishing the same may be understood more readily by reference to the following detailed description of exemplary embodiments and the accompanying drawings. The invention may, however, be embodied in many different forms and should not be construed as being limited to the embodiments set forth herein. Rather, these embodiments are provided so that this disclosure will be thorough and complete and will fully convey the concepts of the invention to those of ordinary skill in the art. In the figures, the dimensions of layers and regions are exaggerated for clarity of illustration. It will also be understood that, unless specified otherwise, when a layer is referred to as being "on" another layer or substrate, that layer may be directly on the other layer or substrate, or intervening layers may also be present. Further, it will be understood that, unless specified otherwise, when a layer is referred to as being "under" another layer, that layer may be directly under or one or more intervening layers may also be present. Like reference numerals refer to like elements throughout the specification.

FIGS. 1A through 1F each illustrate a sectional view of a semiconductor device and FIGS. 1A through 1F together illustrate stages in a manufacturing process according to an exemplary embodiment of the invention. A metal oxide semiconductor (MOS) transistor is used as the semiconductor device in the following description of exemplary embodiments of the invention. One or more aspects of the invention may, however, be applied to other types of semiconductor devices.

In embodiments, a device isolation layer (not shown) for defining an active region may be formed in a predetermined area on a substrate 100. The device isolation layer may be formed using, for example, shallow trench isolation (STI) technology to highly integrate the semiconductor device. For example, a thermal oxide layer (not shown) and a silicon nitride layer liner (not shown) may be formed between the device isolation layer and the substrate 100. Examples of the substrate 100 include a silicon substrate, a silicon on insulator (SOI) substrate, a gallium arsenic substrate, a silicon germanium substrate, a ceramic substrate, a quartz substrate, and a display glass substrate.

As shown in FIG. 1, a high-k dielectric layer 110, a conductive layer 115, and a mask pattern 140 may be sequentially formed on the substrate 100.

The high-k dielectric layer 110 may operate as a gate insulating layer of a MOS transistor in embodiments of the invention. As described above, the high-k dielectric layer may be an insulating layer having a high dielectric constant to help highly integrate the semiconductor device. The high-k characteristic of the high-k dielectric layer 110 may be a result of strong ionic polarization.

The high-k dielectric layer 110 may be formed of a compound, such as, $HfO_2$, HfAlO, $ZrO_2$, ZrSiO, ZrAlO, $Ta_2O_5$, $TiO_2$, $Al_2O_3$, $Nb_2O_5$, $CeO_2$, $Y_2O_3$, $InO_3$, $IrO_2$, $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, and nitrides thereof. The high-k dielectric layer 110 may be formed in a laminate structure. The high-k dielectric layer 110 may be formed of a structure including a plurality of thin layers formed, for example, of one or more of the above described materials.

The high-k dielectric layer 110 may be formed by using a chemical vapor deposition (CVD) method. CVD technology includes atomic layer deposition (ALD) method and metal-organic chemical vapor deposition (MOCVD) method. The high-k dielectric layer 110 may be formed to a thickness of about 10 Å to about 100 Å.

The conductive layer 115, which may be used to form a gate electrode, may include a barrier conductive layer 120 and a gate electrode conductive layer 130. The barrier conductive layer 120 may help reduce and preferably prevent an increase in the equivalent oxide thickness (EOT) that may occur if the high-k dielectric layer 110 reacts with the gate electrode conductive layer 130.

The barrier conductive layer 120 may be formed of a conductive layer that does not react with the high-k dielectric layer 110. In embodiments, the barrier conductive layer 120 may be formed of a conductive layer having an excellent resistance to oxidation to help reduce, and preferably prevent, an oxidation reaction that may cause an increase in the EOT. The barrier conductive layer 120 may be formed of a metal or a metal nitride. For example, the barrier conductive layer 120 may be formed of W, Mo, Ti, Ta, Al, Cu, Hf, Zr, WN, MoN, TiN, TaN, AlN, HfN, ZrN, TaSiN, and combinations thereof.

The barrier conductive layer 120 may be formed by a CVD or a physical vapor deposition (PVD). CVD technology for forming the barrier conductive layer 120 may include an ALD method, a plasma enhanced ALD (PEALD) method, a MOCVD method, and a plasma enhanced CVD (PECVD) method. The barrier conductive layer 120 may be formed to a thickness of less than about 300 Å. In embodiments, the thickness of the barrier conductive layer 120 may be controlled to be less than 300 Å to help reduce, and preferably prevent, a polygate depletion effect, which reduces the inverted capacitance, and to remove the barrier conductive layer 120 by wet etching after a plasma process or an ion implantation.

The gate electrode conductive layer 130 may be formed of polycrystal silicon formed by a CVD method. The CVD method may include an ALD method, a PEALD method, an MOCVD method, and a PECVD method. The gate electrode conductive layer 130 may be formed to a thickness of about 1,000 Å to about 2,000 Å.

The mask pattern 140 for patterning the gate electrode conductive layer 130 may be formed to a thickness of about 300 Å to about 1,000 Å by using $SiO_2$, SiON, or a photoresist.

Figure 1B:
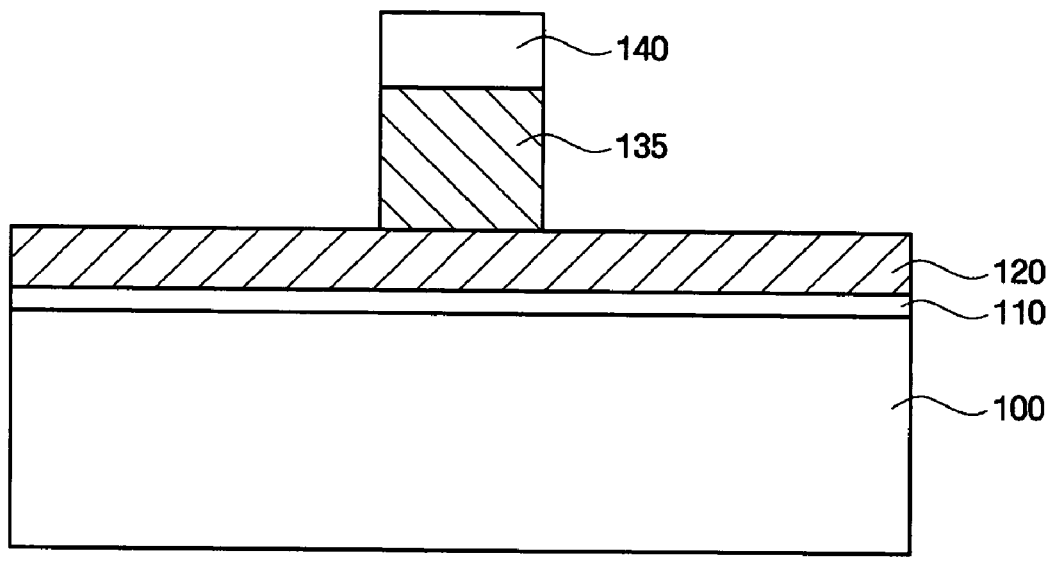

As shown in FIG. 1B, the gate electrode conductive layer 130 may be etched to form a gate electrode 135 using the mask pattern 140 as an etch mask. By having a high etch selectivity between the gate electrode conductive layer 130 and the barrier conductive layer 120, formation of the gate electrode 135 exposes a portion of the barrier conductive layer 120. The gate electrode 135 may be formed by an anisotropic dry etch, which uses the mask pattern 140 as the etch mask.

The barrier conductive layer 120 and the high-k dielectric layer 110 remain after etching of the gate electrode conductive layer 130 to forming the gate electrode 135. The remaining high-k dielectric layer 110 and the barrier conductive layer 120 help reduce, and preferably prevent, damage to the substrate 100 located under the high-k dielectric layer 110.

Figure 1C:
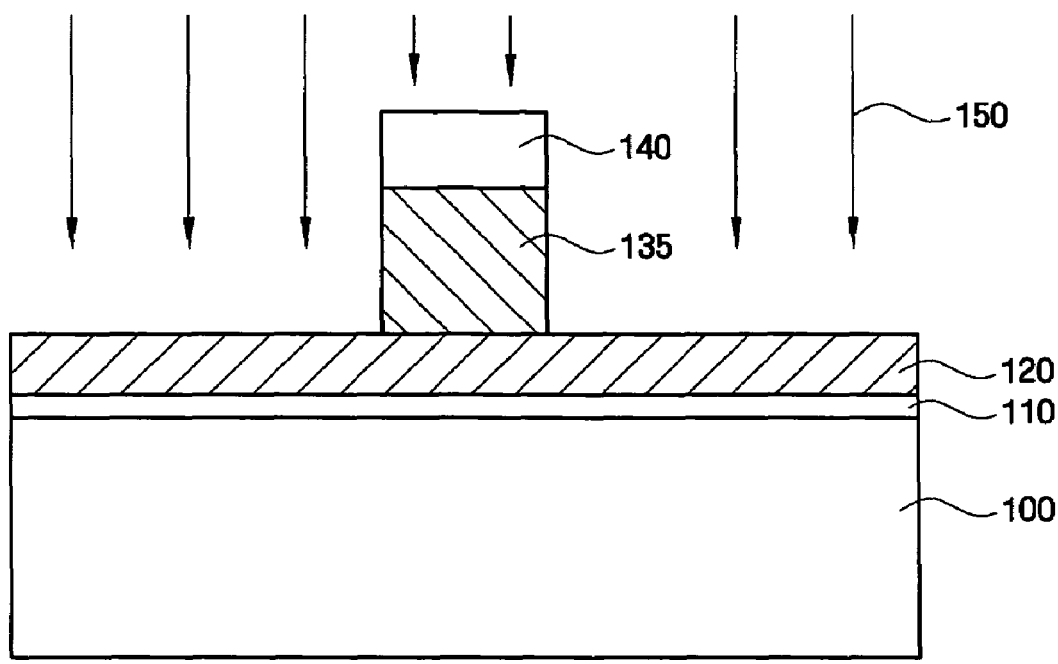

As shown in FIG. 1C, a plasma process or an ion implantation 150 may be performed on the portion of the barrier conductive layer 120 that is exposed by the gate electrode 135 (i.e., the portion of the barrier conductive layer 120 that is not overlapped by the gate electrode 135). By performing a plasma process or an ion implantation 150 on the barrier conductive layer 120, the wet etch rate of the barrier conductive layer 120 may be increased. Changing a phase of the barrier conductive layer 120 into an amorphous phase may increase the wet etch rate of the barrier conductive layer 120. In embodiments, the wet etch rate may be increased by other known methods.

The plasma process and/or the ion implantation 150 may be performed using an $O_2$, $NH_3$ or $N_2$ plasma, or ions, such as He, Ne, Ar, Si, Ge, F, Cl, Br, or In. In embodiments, the plasma process and/or the ion implantation 150 may be performed to increase the wet etch rate of the barrier conductive layer 120 by physically bombarding the barrier conductive layer 120. The wet etch may not be intended to directly etch the barrier conductive layer 120 via a chemical reaction with the barrier conductive layer 120. For example, when the plasma process and/or the ion implantation 150 is performed, the bombardment of ions of the plasma may damage the barrier conductive layer 120 and break the crystalline structure of the barrier conductive layer 120. Thus, at least a portion of the barrier conductive layer 120 may be changed into an amorphous phase. The physical bombardment may cause a small number of atoms or molecules to escape from the barrier conductive layer 120.

Figure 1D:
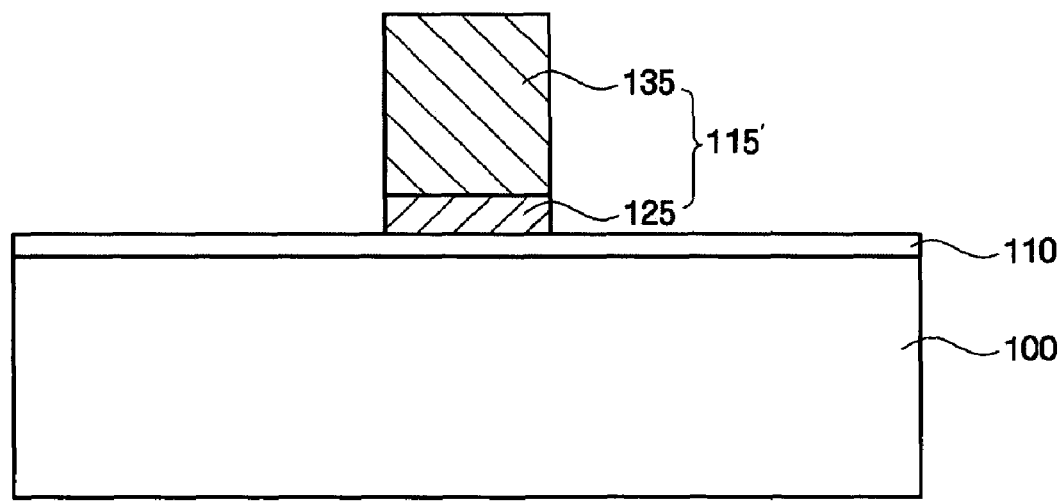

As illustrated in FIG. 1D, the mask pattern 140 that remains on the gate electrode 135 may be removed with the portion of the barrier conductive layer 120 exposed by the mask pattern 140. The remaining (e.g., unexposed portion of the barrier conductive layer 120) may form a barrier conductive layer pattern 125. The structure formed by the barrier conductive layer pattern 125 and the gate electrode 135 may be referred to as a conductive layer pattern 115'. The mask pattern 140 and the barrier conductive layer 120 may be removed by wet etching to minimize damage to the substrate 100 that may occur from the etching. The wet etch may be performed using an etchant that does not react with the gate electrode 135. Etchants such as a HF solution or a new ARL etchant (NAE) may be used. NAE may be formed by combining HF, $H_2O_2$, and deionized water.

The barrier conductive layer 120 may not generally be easy to remove with a wet etch. However, when the barrier conductive layer 120 is removed by dry etching, the substrate 100 may be damaged because the etch selectivity between the barrier conductive layer 120 and the high-k dielectric layer 110 may be low. When a method of fabricating the semiconductor device that employs one or more aspects of the invention is used, the portion of the barrier conductive layer 120 that is exposed by the mask pattern 140 may have an amorphous structure. In an amorphous state there are relatively low forces between atoms, due to the plasma process or the ion implantation 150. When at least a portion of the barrier conductive layer 120 is in the amorphous state, the exposed portion of the barrier conductive layer 120 can be more easily removed by the wet etch and damage to the substrate 100 and the high-k layer 110 can be reduced, and preferably prevented.

As described above with reference to FIGS. 1C and 1D, in embodiments, the barrier conductive layer 120 can be removed by using the plasma process or the ion implantation 150 and the wet etch. In embodiments, other methods for removing the barrier conductive layer 120 may be used. For example, in embodiments, the barrier conductive layer 120 may be removed by dry etching the barrier conductive layer 120 to a predetermined thickness using the mask pattern 140 as an etch mask, followed by performing a plasma process or the ion implantation 150 to the remaining portion of the barrier conductive layer 120 exposed by the mask pattern 140, and further followed by the wet etch to the remaining barrier conductive layer 120. In such embodiments, the barrier conductive layer 120 may be removed without damaging the substrate 100 and the high-k dielectric layer 110 even when dry etching is employed to remove at least a portion of the barrier conductive layer 120.

During the process of removing the barrier conductive layer 120 by the wet etch (described with reference to FIG. 1D), the portion of the high-k dielectric layer 110 exposed by the gate electrode 135 may be removed. A portion of the high-k dielectric layer 110 exposed by the gate electrode 135 may be removed by performing an additional dry etch.

Figure 1E:
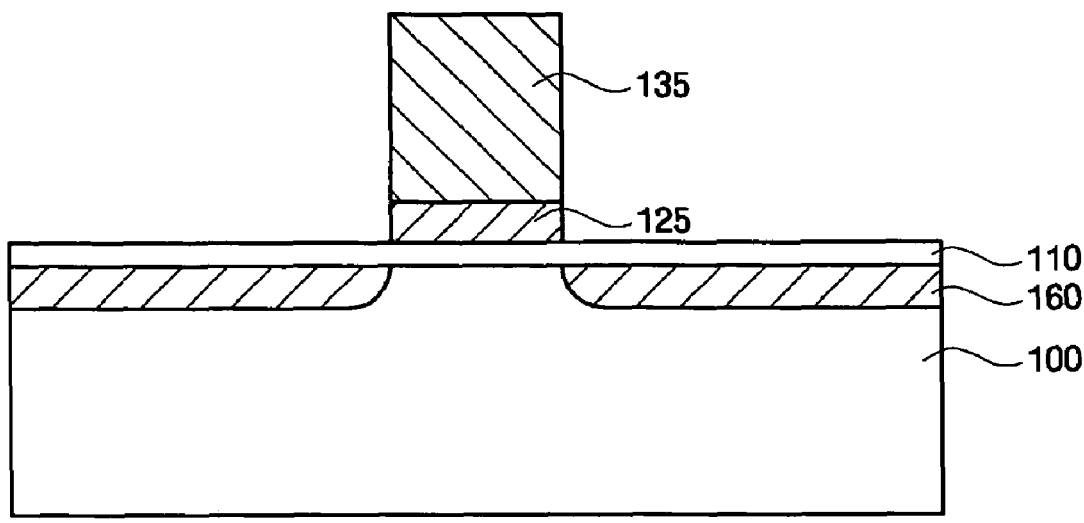

As shown in FIG. 1E, a lowly doped ion implantation may then be performed on the resultant structure using the gate electrode 135 as an ion implantation mask to form a lowly doped impurity region 160 in the substrate 100 around the gate electrode 135.

Figure 1F:
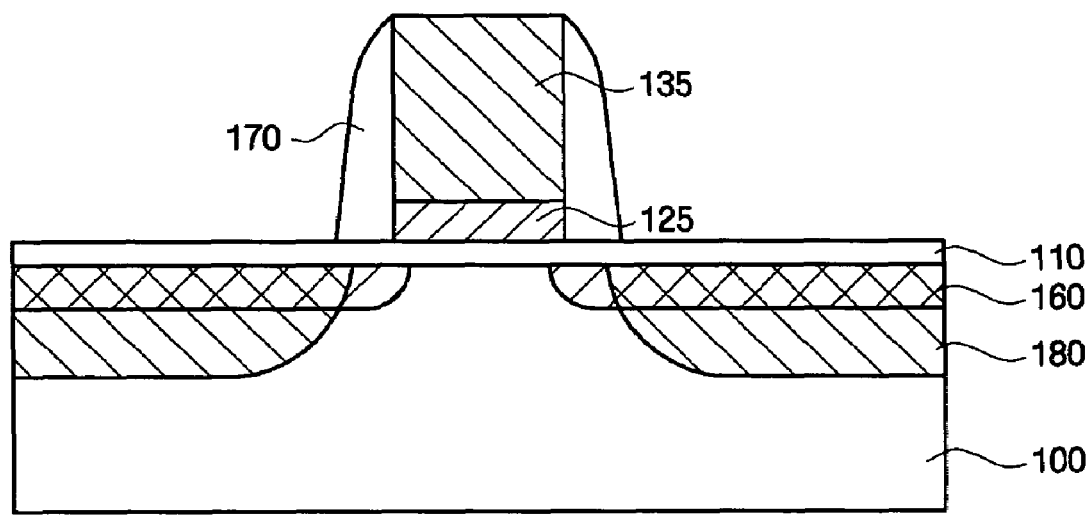

As shown in FIG. 1F, spacers 170 may be formed on the sidewalls of the gate electrode 135. Thereafter, a highly doped ion implantation may be performed by using the spacers 170 as a mask to form, for example, a highly doped impurity region 180 in the substrate 100 around the spacers 170.

Formation of the spacers 170 may include forming a spacer insulating layer (not shown) on the entire surface of the substrate 100, including the lowly doped impurity region 160, and performing an anisotropic etching on the spacer insulating layer.

A thermal process may be performed after the highly doped ion implantation to activate the implanted impurity. An example of such a thermal process is a rapid thermal process (RTP).

As described above, one or more aspects of the invention provide a method for fabricating a MOS transistor semiconductor device that avoids a reaction between a high-k dielectric layer and a gate electrode, and does not damage a substrate during patterning of an electrode. One or more aspects of the invention may be employed by a method of manufacturing a capacitor.

Figure 2:
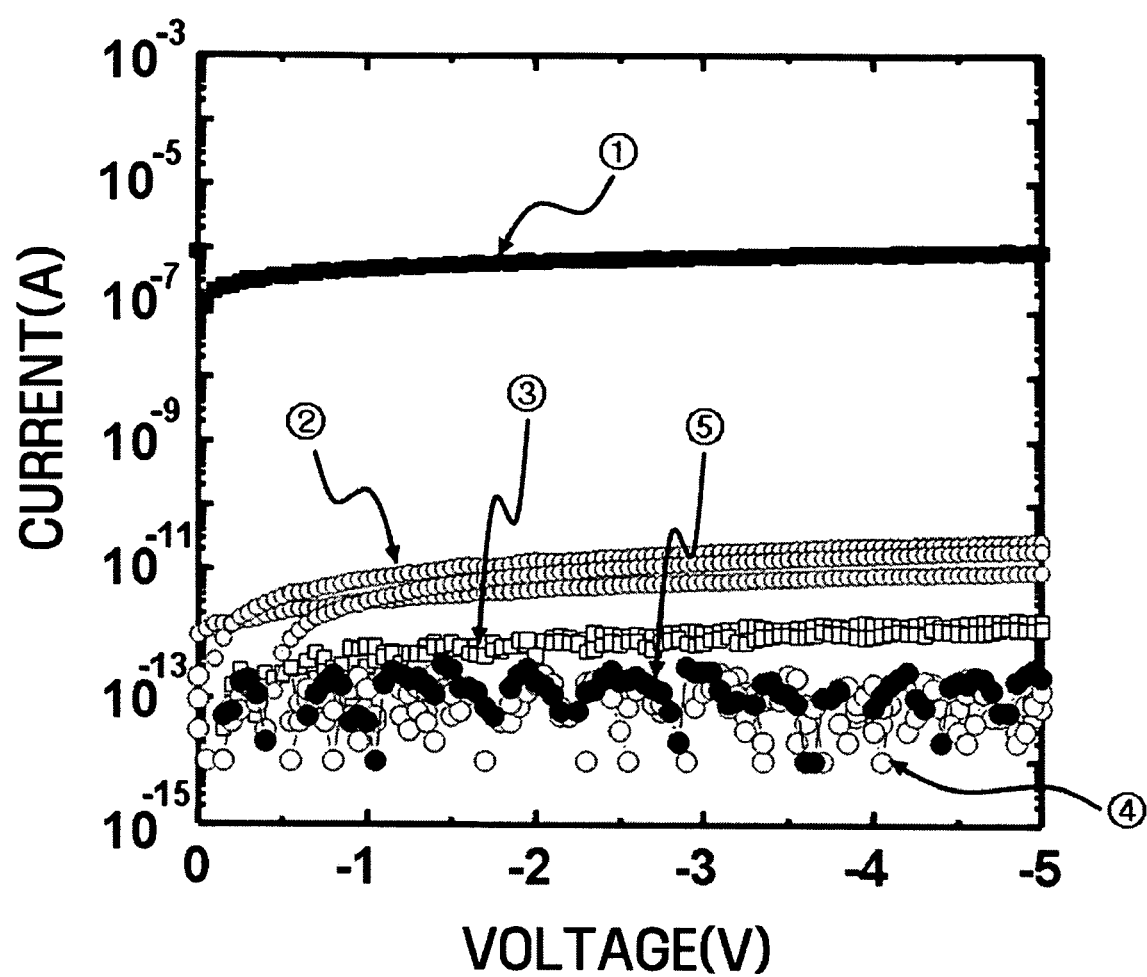
FIG. 2 illustrates a graph showing leakage currents of test samples.

Removal of a barrier conductive layer by changing it into an amorphous state and by wet etching will be further described with reference to the graph shown in FIG. 2. FIG. 2 illustrates a graph showing leakage currents associated with different test samples. The test samples were formed by the following processes. An $SiO_2$ thin layer was formed to a thickness of about 1,000 Å on a Si substrate using, for example, TetraEthyl OrthoSilicate (TEOS). Then, a TaN thin layer was deposited to a thickness of about 40 Å using a PVD method. The TaN thin layer was then processed into an amorphous state using $O_2$ plasma of about 1,500 W for about 0, 1, 3, and 5 minutes. The result is four test samples 1, 2, 3, and 4. Thereafter, the test samples were immersed in a HF solution, which was formed of water and HF in a ratio of 200:1, for about two minutes. Leakage currents flowing through the surfaces of the TaN thin layers of the different test samples 1, 2, 3, and 4 were then measured.

Referring to FIG. 2, test sample 1 refers to the TaN thin layer on which the $O_2$ plasma process was not performed. Test sample 2 refers to the TaN thin layer on which the $O_2$ plasma process was performed for one minute. Test sample 3 refers to the TaN thin layer on which the $O_2$ plasma process was performed for three minutes. Test sample 4 refers to the TaN thin layer on which the $O_2$ plasma process was performed for five minutes. In addition, a test sample 5 functioning as a reference sample was prepared without depositing a TaN thin layer on the $SiO_2$ thin layer.

Referring to FIG. 2, a leakage current of about $10^{-7}$ A was measured from test sample 1. The leakage currents measured from test samples 2, 3, and 4 are about $10^{-11}$ A, $10^{-13}$ A, and $10^{-14}$ A, respectively.

Because the leakage current of the reference sample (test sample 5), which was prepared without depositing a TaN layer, is about $10^{-13}$ A and the leakage current of test sample 1 is about $10^{-7}$, it can be understood that for test sample 1, which was not subjected to the $O_2$ plasma process, the TaN thin layer was not etched by the HF solution.

In the case of test samples 2, 3 and 4, which were subjected to $O_2$ plasma processing, the TaN thin layers were at least partially removed by the HF solution and the leakage currents are significantly reduced compared to the leakage current of test sample 1. As shown in FIG. 2, leakage currents having the same or similar ranges as the leakage current of test sample 5 (without the TaN thin layer) are measured from the test samples 2, 3, and 4.

In embodiments, a barrier conductive layer, for example, a TaN thin layer, may be removed by changing the barrier conductive layer into an amorphous state by, for example, an $O_2$ plasma process followed by a wet etch, for example, an etch using an HF solution. When the barrier conductive layer is removed using a wet etch, damage to a high-k dielectric layer and a substrate located under the barrier conductive layer can be prevented.

In embodiments of the invention, a conductive layer formed of a barrier conductive layer and an electrode conductive layer may be used. In embodiments, a conductive layer may include a barrier conductive layer and an electrode conductive layer formed of the same material. In embodiments, a conductive pattern may be formed by dry etching a portion of the conductive layer, and by wet etching the remaining portion of the conductive layer after performing a plasma process or an ion implantation on the remaining portion of the conductive layer.

Exemplary embodiments of the invention have been disclosed herein, and although specific terms are employed, they are used and are to be interpreted in a generic and descriptive sense only and not for purpose of limitation. Accordingly, it will be understood by those of ordinary skill in the art that various changes in form and details may be made therein without departing from the spirit and scope of the invention as set forth in the following claims.

What is claimed is:

1. A method of fabricating a semiconductor device, the method comprising:
    forming a high-k dielectric layer and a conductive layer on a substrate;
    dry etching a portion of the conductive layer;
    performing a process to increase a wet etch rate on a remaining portion of the conductive layer; and
    forming a conductive layer pattern by wet etching the remaining portion of the conductive layer after performing the process, wherein the wet etching exposes a portion of the high-k dielectric layer.

2. The method according to claim 1, wherein the process to increase the wet etch rate comprises performing a plasma process on the remaining portion of the conductive layer.

3. The method according to claim 2, wherein performing the plasma process includes performing a plasma process using at least one of an $O_2$ plasma, an $NH_3$ plasma, and an $N_2$ plasma.

4. The method according to claim 1, wherein the process to increase the wet etch rate comprises performing an ion implantation on the remaining portion of the conductive layer.

5. The method according to claim 4, wherein performing the ion implantation includes performing ion implantation using at least one of He, Ne, Ar, Si, Ge, F, Cl, Br, and In.

6. The method according to claim 1, wherein forming the conductive layer pattern includes performing a wet etch using an HF solution or an etchant formed by combining HF, $H_2O_2$, and deionized water.

7. The method according to claim 1, wherein forming the high-k dielectric layer includes forming the high-k dielectric layer using at least one of $HfO_2$, HfAlO, $ZrO_2$, ZrSiO, ZrAlO, $Ta_2O_5$, $TiO_2$, $Al_2O_3$, $Nb_2O_5$, $CeO_2$, $Y_2O_3$, $InO_3$, $IrO_2$, $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, and nitrides thereof.

8. The method according to claim 1, wherein:
    forming the conductive layer includes forming the conductive layer by stacking a barrier conductive layer and an electrode conductive layer sequentially on the high-k dielectric layer, and
    dry etching the portion of the conductive layer comprises dry etching the electrode conductive layer.

9. The method according to claim 8, wherein the barrier conductive layer is formed of a metal or a metal nitride.

10. The method according to claim 9, wherein the barrier conductive layer is formed to a thickness of less than about 300 Å.

11. The method according to claim 8, wherein the electrode conductive layer is formed of polycrystal silicon.

12. The method according to claim 8, further comprising removing the exposed portion of the high-k dielectric layer after forming the conductive layer pattern.

13. The method according to claim 8, wherein forming the conductive layer pattern comprises wet etching the barrier conductive layer.

14. The method according to claim 1, further comprising forming a mask pattern defining the conductive layer pattern on the conductive layer after the forming of the conductive layer, wherein forming the conductive layer pattern includes simultaneously wet etching the remaining portion of the conductive layer and the mask pattern.

15. The method according to claim 1, wherein:
   forming the conductive layer includes forming the conductive layer by stacking a barrier conductive layer and an electrode conductive layer sequentially on the high-k dielectric layer, and
   dry etching the portion of the conductive layer comprises dry etching the portion of the electrode conductive layer and a portion the barrier conductive layer.

16. A method of fabricating a semiconductor device, the method comprising:
   sequentially forming a dielectric layer, a metal nitride layer, and polycrystal silicon layer on a substrate;
   forming an electrode by dry etching the polycrystal silicon layer;
   performing a process to increase a wet etch rate of the metal nitride layer on a portion of the metal nitride layer exposed by formation of the electrode; and
   forming a metal nitride layer pattern by wet etching the exposed portion of the metal nitride layer.

17. The method according to claim 16, wherein the dielectric layer is a high-k dielectric layer.

18. The method according to claim 16, wherein the process to increase the wet etch rate comprises performing a plasma process on the exposed portion of the metal nitride layer.

19. The method according to claim 16, wherein the process to increase the wet etch rate comprises performing ion implantation on the exposed portion of the metal nitride layer.

20. The method of claim 16, wherein forming the metal nitride layer pattern exposes a portion of the dielectric layer and the method further comprises removing the exposed portion dielectric layer after forming the metal nitride layer pattern.

21. The method of claim 16, further comprising forming a mask pattern defining the electrode on the polycrystal silicon layer after the forming of the polycrystal silicon layer, wherein the step of forming of the metal nitride layer by wet etching includes simultaneously wet etching the metal nitride layer pattern and the mask pattern.

* * * * *